United States Patent [19]

Gordon et al.

[11] Patent Number: 5,786,268

[45] Date of Patent: Jul. 28, 1998

[54] METHOD FOR FORMING PROGRAMMABLE INTERCONNECT STRUCTURES AND PROGRAMMABLE INTEGRATED CIRCUITS

[75] Inventors: Kathryn E. Gordon, Mountain View; Richard J. Wong, Milpitas, both of Calif.

[73] Assignee: QuickLogic Corporation, Sunnyvale, Calif.

[21] Appl. No.: 904,387

[22] Filed: Aug. 1, 1997

Related U.S. Application Data

[62] Division of Ser. No. 651,102, May 21, 1996, Pat. No. 5,701,027, which is a continuation of Ser. No. 892,466, Jun. 1, 1992, Pat. No. 5,557,136, which is a continuation-in-part of Ser. No. 874,983, Apr. 23, 1992, Pat. No. 5,196,724, which is a continuation of Ser. No. 691,950, Apr. 26, 1991, abandoned, said Ser. No. 892,466, is a continuation-in-part of Ser. No. 891,675, May 28, 1992, abandoned, which is a continuation of Ser. No. 698,648, May 10, 1991, abandoned.

[51] Int. Cl.$^6$ ................................................ H01L 21/44

[52] U.S. Cl. .................... 438/600; 438/131; 438/467; 148/DIG. 55

[58] Field of Search ........................ 438/600, 131, 438/281, 467; 148/DIG. 55

[56] References Cited

U.S. PATENT DOCUMENTS

| | | |
|---|---|---|
| 4,424,578 | 1/1984 | Miyamoto . |
| 4,441,167 | 4/1984 | Principi ................................ 257/530 |
| 4,458,297 | 7/1984 | Stopper et al. . |
| 5,093,711 | 3/1992 | Hirakawa . |

OTHER PUBLICATIONS

Actel Corporation, "Antifuse Backgrounder" (Tsantes & Associates, Sunnyvale, CA, Nov. 1991), pp. 1–10.

*Primary Examiner*—Jey Tsai
*Attorney, Agent, or Firm*—Skjerven, Morrill, MacPherson, Franklin & Friel; Michael Shenker

[57] ABSTRACT

Antifuses and gate arrays with antifuses are disclosed that have high thermal stability, reduced size, reduced leakage current, reduced capacitance in the unprogrammed state, improved manufacturing yield, and more controllable electrical characteristics. Some antifuses include spacers in the antifuse via. In some antifuses, the programmable material is planar, and the top or the bottom electrode is formed in the antifuse via. In some gate arrays, the antifuses are formed above the dielectric separating two levels of routing channels rather than below that dielectric.

6 Claims, 12 Drawing Sheets

METHOD FOR FORMING PROGRAMMABLE INTERCONNECT STRUCTURES AND PROGRAMMABLE INTEGRATED CIRCUITS

CROSS-REFERENCE TO RELATED APPLICATIONS

This application is a division of application Ser. No. 08/651,102 filed May 21, 1996, now U.S. Pat. No. 5,701,027 which is a continuation of application Ser. No. 07/892,466 filed Jun. 1, 1992, now U.S. Pat. No. 5,557,136, which is a continuation-in-part of application Ser. No. 07/874,983 filed Apr. 23, 1992, now U.S. Pat. No. 5,196,724, which is a continuation of application Ser. No. 07/691,950 filed Apr. 26, 1991, now abandoned. The above-mentioned application Ser. No. 07/892,466 is also a continuation-in-part of application Ser. No. 07/891,675 filed May 28, 1992, now abandoned, which is a continuation of application Ser. No. 07/698,648 filed May 10, 1991, now abandoned. The disclosures of the aforementioned applications Ser. No. 07/874,983, Ser. No. 07/691,950 and Ser. No. 07/698,648 are hereby incorporated herein by reference.

BACKGROUND OF THE INVENTION

1. Field of the Invention

The present invention relates to programmable integrated circuits and methods for fabrication thereof, and more particularly to antifuses and circuits and outing structures incorporating antifuses, and methods for fabrication thereof.

2. Description of Related Art

Programmable semiconductor devices include rogrammable read only memories ("PROMs"), programmable logic devices ("PLDs"), and programmable gate arrays. Programmable elements suitable for one or more of these device types include fuses and antifuses.

A fuse is a structure which electrically couples a first terminal to a second terminal, but which, when programmed by passage of sufficient current between its terminals, electrically decouples the first terminal from the second terminal.

An antifuse is a structure which when unprogrammed does riot electrically couple its first and second terminals, but which, when programmed by applying sufficient voltage between the first and second terminals, permanently electrically connects the first and second terminals. One type of antifuse comprises an amorphous silicon which forms conductive polysilicon when heated.

FIG. 1 illustrates an example of antifuse technology for a CMOS circuit. Antifuses 10a and 10b are part of an array of such antifuses that are formed on a silicon semiconductor substrate 14 over an oxide layer 16. Before the antifuses are formed, layer 16 is patterned and etched to provide contact openings (not shown) to transistor source/drain regions, and layer 16 is flowed to smooth the sides of the contact openings. The contact openings are formed before the antifuses in order not to expose the antifuses to the high temperatures of the flowing step.

Antifuses 10a, 10b are formed as follows. The first layer 18 of TiW is deposited over the entire surface of the substrate 14 and over one or more circuit elements (not shown), such as transistor source/drain regions, which were exposed by the contact openings in layer 16. The first TiW layer 18 serves two purposes: one, as a protective cover for the exposed circuit elements while antifuses 10 are being formed, and the other is to provide the bottom electrode for antifuses 10. Portions of the first TiW layer 18 are appropriately masked, and the first etch of TiW 18 is performed to define the protective cover and the bottom electrodes.

A layer of dielectric material 20 such as 2000 angstroms of oxide is formed over the TiW layer 18 and then masked and etched to define antifuse vias 22a and 22b. The dielectric 20 is removed over those portions of the first TiW layer 18 which cover and protect the CMOS circuit elements.

A layer 25 of 1500 angstroms of amorphous silicon is then deposited. A second layer 26 of TiW is deposited over the amorphous silicon layer 25. The two layers are masked and etched to define the array of antifuses such as typically shown at 10a, 10b.

Then the structure is masked, and a second etch of the TiW layer 18 is performed to remove the portion of TiW layer 18 that has served as a protective cover for the CMOS circuit elements.

Then first-metal aluminum 27 is formed on the second layer 26 of TiW for each respective antifuse structure 10 when the first metallization for the integrated circuit components is formed. Metal layers 26, 27 provide the top electrodes to antifuses 10.

A standard intermetal dielectric layer 28 is formed over the wafer. Vias like via 29 are etched through dielectric layers 28 and 20 to the first TiW layer 18. A conductor 30 of second-metal aluminum is formed over the dielectric layer 28 and in vias 29. Portions of conductor 30 in vias 29 provide connections between the bottom electrodes 18 and the second metal 30 so as to reduce the connection resistance to the antifuses 10. See generally U.S. Pat. No. 4,914,055 issued Apr. 3, 1990 to Gordon et al.

Certain improvements are desirable in some prior art antifuse circuits, including reduced size, reduced leakage current (i.e. current in the unprogrammed state), reduced capacitance, greater reliability, improved manufacturing yield, and more controllable electrical characteristics such as leakage current, programming voltage, and capacitance in the unprogrammed state.

SUMMARY OF THE INVENTION

The present invention provides, in some embodiments, a reliable antifuse with reduced leakage current, reduced capacitance in the unprogrammed state, improved yield and more controllable electrical characteristics. Reliability is also improved in that the antifuse, when programmed, is thermally stable, i.e. reliable in the presence of temperature changes. These advantages are achieved in some embodiments by providing dielectric spacers in the antifuse via. The spacers overlay the via sidewalls over the amorphous silicon and underlay the top electrode. The spacers are advantageous for the following reasons.

When the antifuse is programmed, a conductive filament forms in the antifuse through a thinner portion of the amorphous silicon. The thinner portion is often in the corner of the antifuse via, and hence, in prior art antifuses, the conductive filament is adjacent to the oxide sidewalls of the via. The oxide and the conductive filament have significantly different thermal expansion coefficients, and the thermal stress resulting from temperature variations can cause the conductive filament to crack and become non-conductive, leading to circuit failure.

According to the invention, the dielectric spacers cover the corner portions of the amorphous silicon, and hence the conductive filament will form farther away from the via sidewalls. The filament will be surrounded by the amorphous silicon. Because the filament and the amorphous silicon have similar thermal expansion coefficients, the thermal stress on the filament due to temperature variations becomes reduced, and the circuit reliability becomes therefore higher.

Other advantages over the prior art provided by the spacers in some embodiments include reduced leakage current, reduced capacitance in the unprogrammed state, improved yield and more controllable electrical characteristics, as explained more fully below.

The present invention also provides embodiments in which the amorphous silicon layer is planar. The thermal stress; on the conductive filament resulting from temperature variations is low because the filament through the planar amorphous silicon is surrounded by the amorphous silicon and the filament does not laterally adjoin a material, such as silicon dioxide, with a significantly dissimilar thermal expansion coefficient. Further, the planarity of the amorphous silicon facilitates high quality amorphous silicon deposition. Some of these embodiments allow reduction in the antifuse size, as explained below.

The invention is not limited by the use of amorphous silicon. Other programmable materials are used in some embodiments of the invention.

The present invention provides also programmable circuits, such as gate arrays, using antifuses. In some embodiments, the antifuses are formed over the intermetal dielectric. This arrangement provides better protection for the underlying transistors (typically gate array transistors) during the antifuse formation. That arrangement also provides better protection for the antifuses because the antifuses are not exposed to the high temperatures present during the formation of the intermetal dielectric and the first-metal contacts. The capacitance in some gate arrays also becomes reduced as explained below.

Other features of the invention are described below. The invention is defined by the appended claims.

DESCRIPTION OF THE PREFERRED EMBODIMENTS

Figure 1:
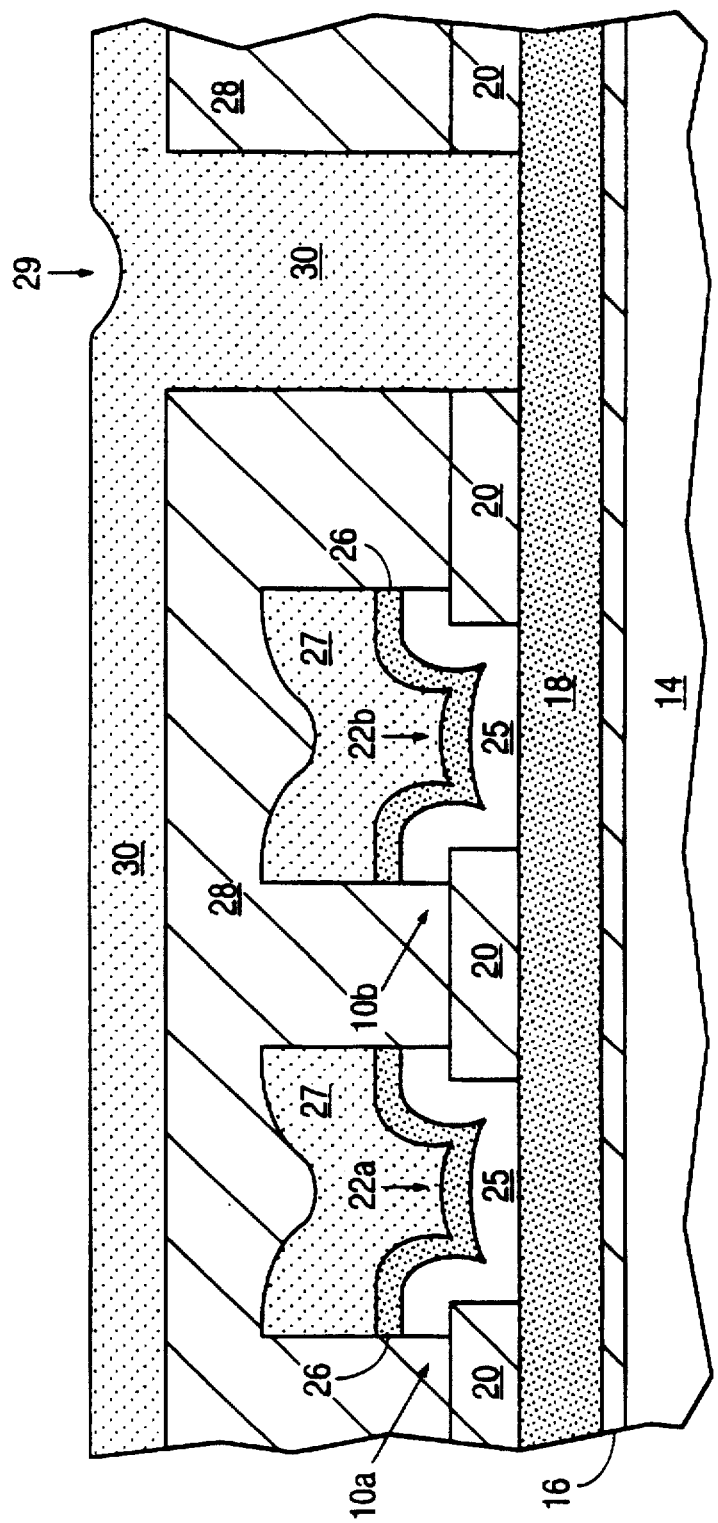
FIG. 1 is a cross-section illustration of a portion of a prior art CMOS integrated circuit having amorphous silicon antifuses.
Figure 2:
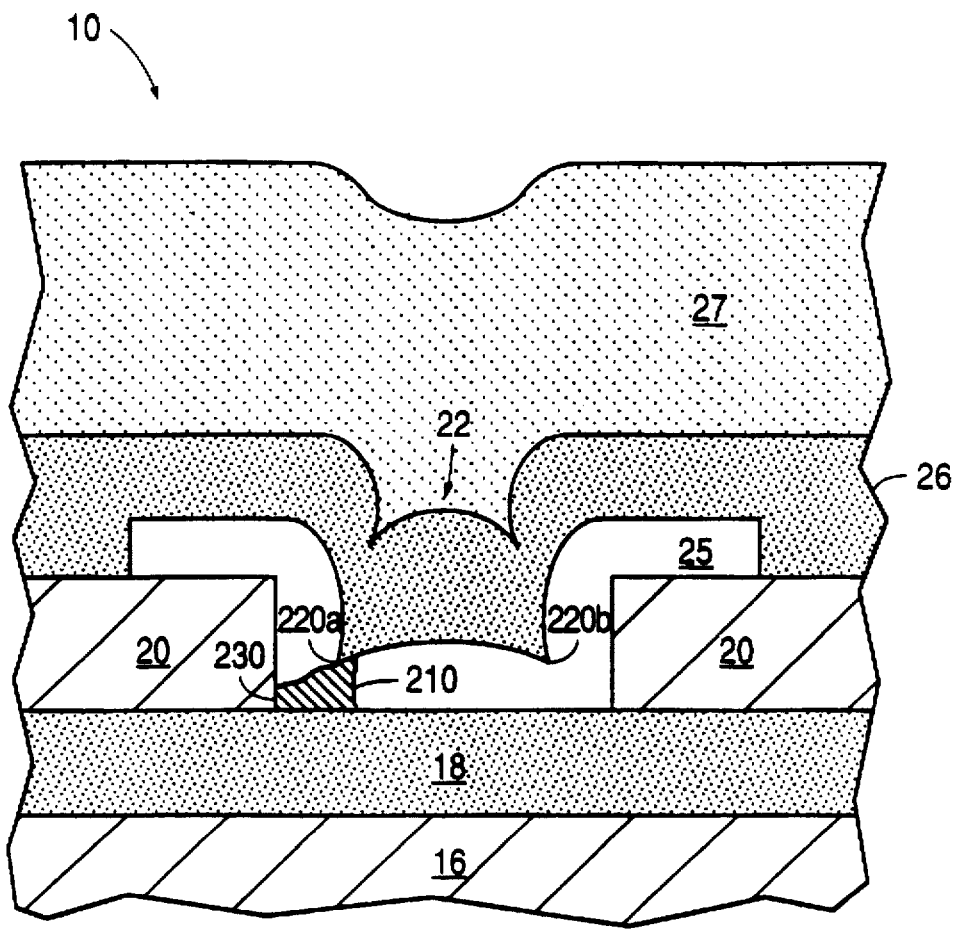
FIG. 2 is a cross-section illustration of an antifuse in the circuit of FIG. 1.

FIG. 2 shows a prior art antifuse 10, such as antifuses 10a, 10b of FIG. 1, after the antifuse has been programmed by applying a programming voltage and passing a programming current between the top electrode layers 26, 27 and bottom electrode layer 18. During programming, the amorphous silicon 25, which is nonconductive, forms a conductive filament at its thinner portion. Current flows through the programming path heating the amorphous silicon 25 and forming a conductive filament 210. Filament 210 includes a mixture of silicon, tungsten, tungsten silicide and titanium. The tungsten, both pure and in the form of tungsten silicide, and the titanium are from TiW layers 18 and 26. The TiW of layers 18 and 26 is about 90% by weight tungsten and about 10% by weight titanium, so the total amount of tungsten in filament 210, including the pure tungsten and the tungsten in the tungsten silicide, exceeds the amount of titanium in filament 210.

Amorphous silicon 25, formed by chemical vapor deposition, is typically thinner near the bottom corners of via 22 as shown at 220a, 220b in FIG. 2. See A. C. Adams, "Plasma Deposition of Inorganic Films." Solid State Technology, April 1983, pages 135–139 incorporated herein by reference. During programming, amorphous silicon 25 breaks down at such a thinner portion, portion 220a in FIG. 2, and conductive filament 210 forms in the corner of via 22. The width of conductive filament 210 depends on the programming current. In a typical application, in order to reduce the antifuse resistance to 50 Ω or below, filament 210 is made to be at least 0.15μ wide. More particularly, the filament in top view is typically an oval stretched out along the edge of via 22. The width of the filament oval is about 0.15μ, and the length of the oval is about 0.3μ. At this width, lateral surface 230 of filament 210 typically contacts silicon dioxide 20 or is quite close to silicon dioxide 20.

As a result, conductive filament 210 is much affected by the thermal stress resulting from the effect of the difference between the thermal expansion coefficients of the silicon dioxide 20 on the one hand and the material of conductive filament 210 (i.e., mixture of silicon, tungsten, tungsten silicide and titanium) on the other hand during changes in the temperature of the circuit. Table 1 below lists the linear thermal expansion coefficients (LTECs) of the materials involved.

TABLE 1

| Material | Linear Thermal Expansion Coefficient (LTEC), at 25° C., times $10^7$, per degree Celsius |
|---|---|
| $SiO_2$ | 5.0 |
| Si | 26 |
| $WSi_2$ | 62.5 to 79 |
| W | 45 |
| Ti | 85 |

Figure 3:
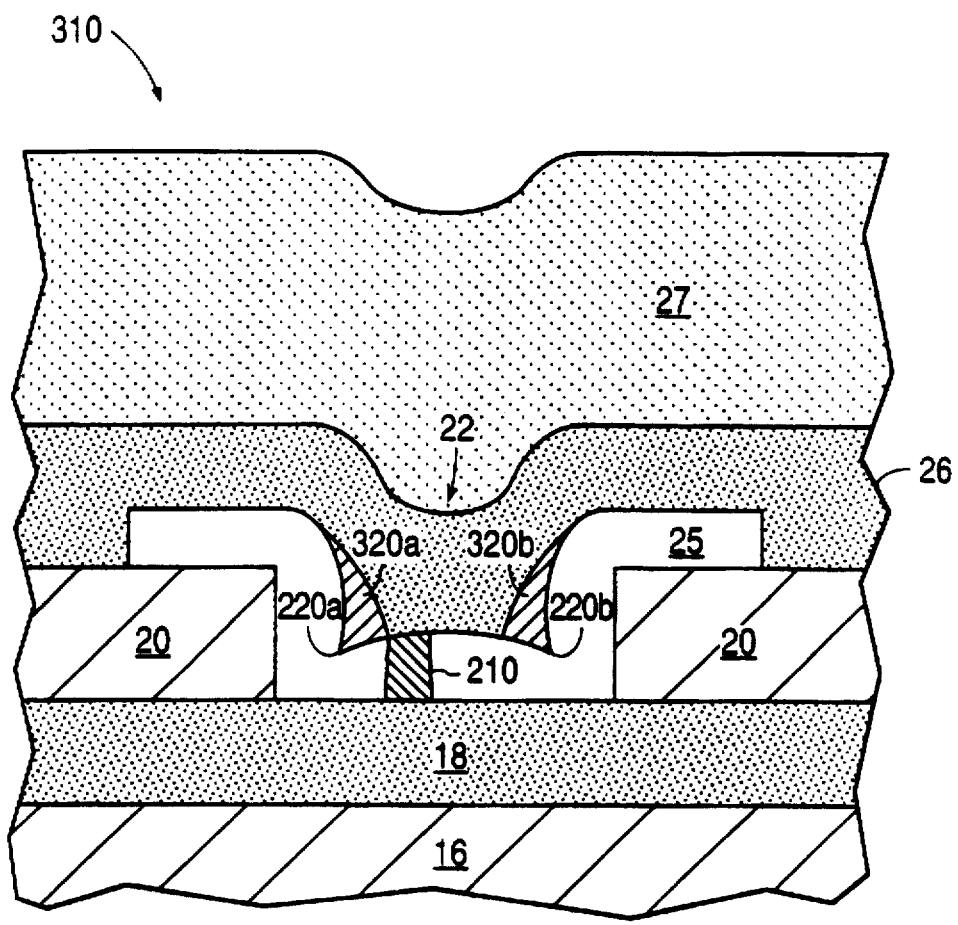
FIGS. 3–7 are cross-section illustrations of antifuses according to the present invention.

As Table 1 indicates, the LTECs of the materials of conductive filament 210 are at a minimum over five times greater than the LTEC of silicon dioxide. The thermal stress, caused by cooling or heating of the structure, between filament 210 and silicon dioxide 20 can cause filament 210 to crack. If filament 210 cracks, the low resistance path between the electrodes 18 and 26, 27 will no longer exist, and the circuit using the antifuse will fail;

FIG. 3 shows an antifuse 310 in which the thermal stress on the conductive filament is reduced. Antifuse 310 includes dielectric spacers 320a, 320b that overlay the thinner portions 220a, 220b of amorphous silicon 25. Spacers 320a, 320b force the conductive filament 210 to form away from the sidewalls of via 22, in the thinnest amorphous silicon portion not covered by the spacers. Thus, the programming path, i.e. the location at which the conductive filament forms during programming, is moved away from the sidewalls. The thermal stress on filament 210 is reduced because filament 210 is surrounded laterally by amorphous silicon 25 and because conductive filament 210 and amorphous silicon 25 have similar thermal expansion coefficients.

Dielectric spacers 320a, 320b provide also the advantages of reduced leakage current, increased yield, more controllable electrical characteristics and reduced capacitance in antifuse 310. The leakage current is reduced because spacers 320a, 320b reduce the contact area between the TiW layer 26 and amorphous silicon 25. In one embodiment, the radius of the amorphous silicon on the bottom of via 22 between thinner portions 220a, 220b is 0.5μ. The spacer width at the bottom of the spacer is 0.1μ. Thus the spacers reduce the contract area at the bottom of via 22 between amorphous silicon 25 and the TiW layer 26 from $\pi \times (0.5\mu)^2 = 0.25\pi\mu^2$ to $\pi \times (0.4\mu)^2 = 0.16\pi\mu^2$, i.e. more than 1.5 times. The leakage current is reduced proportionately. In one embodiment in which the amorphous silicon thickness at the bottom of via 22 varies from about 850 Å at thinner portions 220a, 220b to about 1000 Å in the middle of the via, the leakage current is over 1.5 nA if spacers 320a, 320b are not used, and the leakage current is about 1.0 nA with the spacers.

The yield is increased because spacers 320a, 320b improve the step coverage of TiW layer 26 and, by improving the step coverage, the spacers help prevent aluminum 27 from spiking into amorphous silicon 25. Namely, TiW layer 26 is a barrier layer that prevents aluminum of layer 27 from spiking into the amorphous silicon 25. Aluminum spikes are undesirable because they increase leakage current and, moreover, can short the antifuse. In antifuse 10 of the prior art FIG. 2, barrier layer 26 is thinned on the sidewalls of amorphous silicon 25 and over thinner portions 220a, 220b of the amorphous silicon. Discontinuities in barrier layer 26 are also possible. The aluminum of layer 27 could spike through the thinner portions or discontinuities of barrier layer 26, mixing into amorphous silicon 25. In antifuse 310, spacers 320a, 320b smooth the surface on which barrier layer 26 is deposited. Barrier layer 26 as formed in the structure of FIG. 3 has more uniform thickness and is not thinned as much in via 22 as in the structure of FIG. 2. Discontinuities in barrier layer 26 are also less likely. Hence the probability of antifuses rendered inoperative by spiking is reduced, and the yield is improved.

The antifuse electrical characteristics are more controllable for the following reasons. The electrical characteristics which include the programming voltage, the leakage current and the capacitance in the unprogrammed state, depend on the thickness of the amorphous silicon.

The amorphous silicon thickness is more difficult to control in the via corners near the sidewalls. By covering the amorphous silicon portions in the corners, the spacers reduce the effect of these portions on the antifuse electrical characteristics. The electrical characteristics become more dependent on the more controllable amorphous silicon thickness away from the sidewalls. The electrical characteristics hence become more controllable and easier to reproduce.

Spacers 320a, 320b reduce the capacitance of antifuse 310 in the unprogrammed state by moving portions of the top electrode layers 26, 27 farther from the bottom electrode 18. Since the capacitance is reduced, the circuit speed is increased.

In some embodiments, via 22 is round in top view (not shown). Spacers 320a, 320b are parts of one contiguous, annular spacer that runs along the bottom corner of via 22. Thinner portions 220a, 220b of amorphous silicon 25 are also part of one contiguous thinner portion running along the bottom corner of via 22.

Antifuse 310 is fabricated as follows. First dielectric layer 16, typically of silicon dioxide, is formed on a silicon substrate (not shown), and patterned to expose portions of the substrate. Alternatively, the dielectric layer 16 may be formed upon a lower conductive layer (not shown) rather than on the substrate. First conductive layer 18 is formed on dielectric layer 16 and patterned to form appropriate interconnects. The first conductive layer 18 provides the bottom electrode of antifuse 310. In one embodiment, the first conductive layer 18 is a layer of a barrier metal such as titanium tungsten (TiW), about 2000 angstroms thick, deposited by sputtering. Other conductive materials may also be used.

Second dielectric layer 20 is formed on the first conductive layer 18. In one embodiment, the second dielectric layer 20 is a layer of silicon dioxide, about 3000 angstroms thick, deposited using plasma enhanced chemical vapor deposition ("PECVD"). The second dielectric layer 20 is patterned to form vias, such as via 22, exposing first conductive layer 18.

Layer 25 of amorphous silicon is deposited and patterned over antifuse via 22. As is explained in U.S. patent application Ser. No. 07/447,969 filed Dec. 8, 1989 whose disclosure is hereby incorporated herein by reference thereto, the thickness of amorphous silicon layer 25 in contact with first conductive layer 18 at the bottom of antifuse via 22 is an important factor in controlling the programming voltage of the antifuse. In this embodiment, the thickness of amorphous silicon layer 25 is about 1600 angstroms, which results in a programming voltage of about 12 volts. Of course, other programming voltages may be achieved by depositing the amorphous silicon layer 25 to an appropriate thickness. Further, layer thickness and feature size are selected to minimize leakage current, consistent with the process used and the programming voltage desired. In the present embodiment, the feature size is about 1.2 μm and, as has been mentioned, the layer thickness is 1600 angstroms.

In one embodiment, the amorphous silicon layer 25 is deposited using plasma enhanced chemical vapor deposition ("PECVD"). A suitable reactor is the Concept One reactor available from Novellus Systems, Inc., San Jose, Calif. The process reactants are SiH4 and argon.

The reaction is carried out at a temperature of 400° C. In general, temperatures within the range of about 200° C. to about 500° C. are believed suitable. The resultant deposition and evolved by-products are amorphous silicon and hydrogen.

Amorphous silicon formation by PECVD is described generally in A. C. Adams, "Plasma Deposition of Inorganic Films," Solid State Technology, April 1983, pages 135–139, hereby incorporated herein by reference thereto.

Next spacers 320a, 320b are formed as follows. A substantially conformal layer of silicon dioxide, about 2000 angstroms thick, is deposited by PECVD over the amorphous silicon 25. A suitable reactor is the Concept One reactor described hereinabove. The process reactants are SiH4 and oxygen. The deposition is carried out at 400° C. This silicon dioxide layer is etched using isotropic reactive ion etching ("RIE") to form spacers 320a and 320b over the respective thinner portions 220a and 220b. Spacers 320a and 320b smooth the surface above the amorphous silicon layer 25 and thus improve the top electrode step coverage. Further, spacers 320a and 320b reduce leakage current.

In one embodiment, spacers 220a, 220b are formed of silicon nitride.

About 2000 angstrom layer 26 of titanium tungsten (TiW) and about 8000 angstrom layer 27 of aluminum-copper (AlCu) are sputter deposited and patterned to form the top electrode. Spacers 320a and 320b smooth the topography and improve the TiW layer 26 step coverage.

In some embodiments, spacers 320a, 320b are formed under amorphous silicon 25 directly over bottom electrode 18.

Figure 4:
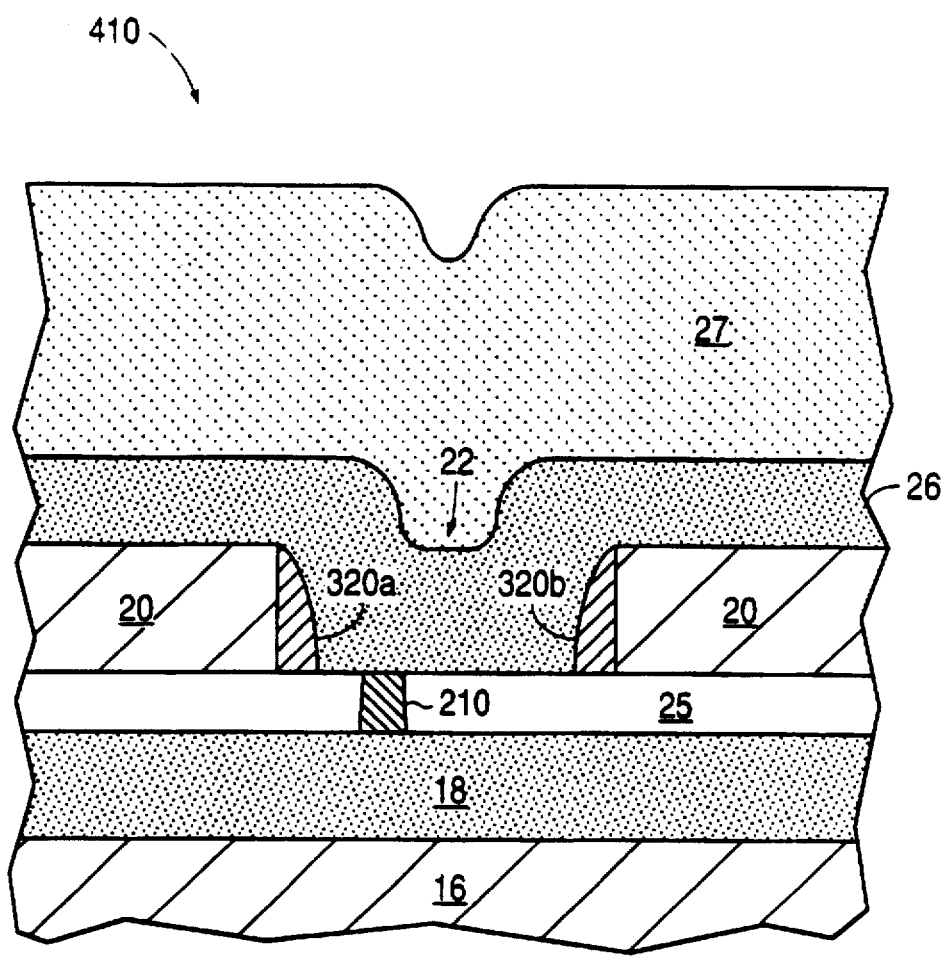

FIG. 4 shows an antifuse 410 in which high thermal stability is achieved by making amorphous silicon 25 planar and not surrounded laterally near via 22 by silicon dioxide. Antifuse 410 includes a first dielectric layer 16 formed on the silicon substrate (not shown) or on a lower conductive layer (not shown). First conductive layer 18 providing the bottom electrode is deposited over dielectric layer 16. Bottom electrode 18 in some embodiments is an about 2000 Angstrom thick layer of a barrier metal such as TiW.

Amorphous silicon layer 25, 1600 Angstroms thick in one embodiment, is deposited above bottom electrode 18 by plasma enhanced chemical vapor deposition (PECVD) using the process described above in connection with FIG. 3.

A second dielectric layer 20 is formed over amorphous silicon layer 25. In one embodiment, second dielectric layer 20 is a layer of silicon dioxide, about 3000 angstroms thick, deposited using PECVD. The second dielectric layer 20 is patterned to form vias, such as via 22, exposing the amorphous silicon 25. These vias, in particular via 22, will serve as sites for antifuses.

A dielectric material, such as silicon dioxide or silicon nitride, is deposited and etched isotropically to form spacers 320a, 320b over the sidewalls of via 22.

About 2000 angstrom layer 26 of TiW and about 8000 angstrom layer 27 of aluminum-copper are sputter deposited and patterned to form the top electrode. TiW layer 26 serves to prevent the aluminum of AlCu layer 27 from spiking into the amorphous silicon 25. Aluminum spikes are undesirable because they increase the leakage current or even short the antifuse.

Conductive filament 210 of antifuse 410 is surrounded laterally by the unprogrammed amorphous silicon 25. Since the amorphous silicon and the material of conductive filament 210 have similar thermal expansion coefficients, high thermal stability is achieved.

Spacers 320a, 320b reduce the leakage current by reducing the contact area between barrier layer 26 and amorphous silicon 25 and by providing additional resistance between barrier layer 26 and first conductive layer 18.

Spacers 320a, 320b also increase the yield of antifuse 410 by improving the step coverage of barrier layer 26 so as to reduce or eliminate the thinning of the barrier layer.

Another factor improving the yield is that the amorphous silicon 25 is planar and hence a high quality deposition with reproducible and uniform thickness is facilitated. Of note, the thickness and the thickness uniformity of the amorphous silicon are an important factor in controlling the antifuse programming voltage, leakage current and the capacitance in the unprogrammed state.

Spacers 320a, 320b reduce the capacitance of antifuse 410 in the unprogrammed state by moving portions of the top electrode layers 26, 27 farther from the bottom electrode layer 18.

In some embodiments, spacers 320a, 320b are omitted. One such embodiment is disclosed in the aforementioned U.S. patent application Ser. No. 07/691,950 filed by K. E. Gordon and R. J. Wong.

Figure 5:
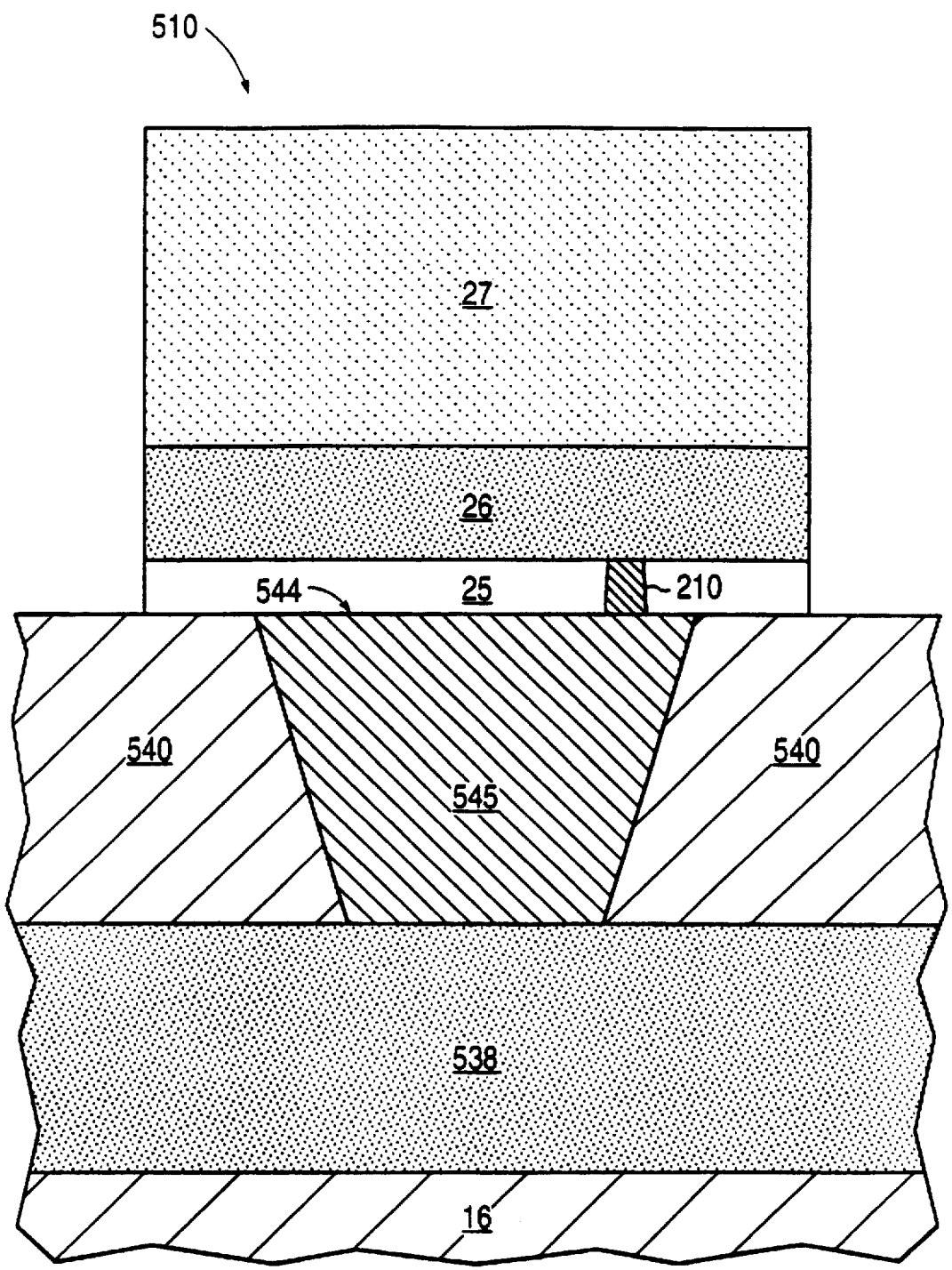

FIG. 5 shows a cross section of another thermally stable antifuse 510 described in the aforementioned U.S. patent application Ser. No. 07/698,648 filed by K. E. Gordon and R. J. Wong. Antifuse 510 is formed as follows.

First dielectric layer 16, typically of silicon dioxide, is formed and patterned as described above in connection with FIG. 3. First conductive layer 538 is formed on dielectric layer 16 and patterned to form appropriate interconnects. In one embodiment, the first conductive layer 538 is a layer of aluminum. In another embodiment, the first conductive layer 538 is TiW. In still another embodiment, the first conductive layer 538 comprises various conductive layers (not shown), including a thin layer of titanium covered by a thicker layer of aluminum. Other conductive layers are suitable as well.

A second dielectric layer 540 is formed on the first conductive layer 538. The second dielectric layer 540 is patterned to form vias, such as via 544, exposing the first conductive layer 538.

A plug 545 of conductive material is formed in via 544 so as to fill the via. Plug 545 provides the bottom electrode of the antifuse. The top surface of plug 545 is substantially coplanar with the top surface of the second dielectric layer 540. Consequently, to-be-formed amorphous silicon layer 25 will be planar. Formation of high quality, uniform layer 25 is thereby facilitated. Further, the planarity of amorphous silicon layer 25 improves the thermal stability of the antifuse because conductive filament 210, formed when antifuse 510 is programmed, will be laterally surrounded by amorphous silicon.

In one embodiment, plug 545 is made of tungsten. Tungsten plugs have been used to provide interlevel contacts between different conductive layers. Any suitable tungsten plug deposition technique may be used. For example, in one technique, plug 545 is formed by selective chemical vapor deposition ("CVD") of tungsten in the via 544. At the bottom of via 544, the material of first conductive layer 538 reacts with gaseous reactants so as to form tungsten in via 544. No tungsten is deposited, however, on top of the second dielectric layer 540 during the selective CVD. Selective CVD of tungsten is described generally in R. V. Joshi et al., "Low-Resistance Submicron CVD W Interlevel Via Plugs on Al-Cu-Si," VMIC Conference, Jun. 12–13, 1989, pp. 113–121, available from the Institute of Electrical and Electronic Engineers ("IEEE") of Piscataway, N.J. and hereby incorporated herein by reference thereto. See also T. Ohba, "Selective and Blanket Tungsten Interconnection and its Suitability for 0.2-Micron ULSI," VMIC Conference, Jun. 12–13, 1990, pp. 226–232, available from IEEE and hereby incorporated herein by reference thereto; T. Moriya et al., "A Planar Metallization Process—Its Application to Tri-Level Aluminum Interconnection," 83 IEDM 550, hereby incorporated herein by reference thereto.

In another technique, plug 545 is formed by a blanket CVD of tungsten followed by etch-back. The blanket CVD of tungsten provides a tungsten layer with a planar top surface. The tungsten layer is etched until tungsten is etched off the top of the second dielectric layer 540. In a variation, a thin adhesion layer of TiW (not shown) is sputtered on the surface of the via 544 before the blanket CVD of the tungsten layer. In another variation, a sacrificial layer of silicon nitride (not shown) is deposited on top of the second dielectric layer 540 before the via 544 is formed. The silicon nitride protects the surface of the second dielectric layer 540 and reduces the loading effects during the etch of the tungsten layer. After the etch, the remaining silicon nitride is removed. Tungsten plug formation by blanket CVD and etch-back is generally described in J.M.F.G. van Laarhoven et al., "A Novel Blanket Tungsten Etchback Scheme," VMIC Conference, Jun. 12–13, 1989, pp. 129–135, available from IEEE and hereby incorporated herein by reference thereto.

In another variation, plug 545 is formed by selective CVD of tungsten into the lower portion of via 544 and then by the blanket CVD of tungsten and an etch-back so as to fill up the via 544. See generally T. Ohba et al., supra.

Layer 25 of amorphous silicon is deposited and patterned over the via 544. Layer 25 is planar, and deposition of high quality amorphous silicon having uniform thickness and consistent, easily reproducible physical and electrical characteristics is thereby facilitated. The yield is therefore improved. In one embodiment, the thickness of amorphous silicon layer 25 is about 1600 angstroms. Of course, other thicknesses are suitable depending on the programming voltage desired.

As described in the above-mentioned application Ser. No. 07/447,969, one factor controlling leakage current is the manner of deposition of the amorphous silicon layer 25. In one embodiment, the amorphous silicon layer 25 is deposited using plasma enhanced chemical vapor deposition ("PECVD"). A suitable reactor is the Concept One reactor available from the Novellus Systems, Inc., San Jose, Calif. Suitable reactants and process parameters are described generally in the above-mentioned application Ser. No. 07/447,969.

The second electrode of antifuse 510 is formed by sputter depositing an about 2000 angstrom barrier layer 26 of titanium tungsten (TiW) and an about 8000 angstrom layer 27 of aluminum-copper (AlCu). TiW layer 26 and AlCu layer 27 are patterned to form the second electrode. The mask used for patterning the second electrode layers 26 and 27 is smaller than the mask used to pattern the amorphous silicon 25 so that, in the worst misalignment case, the entire second electrode is above amorphous silicon 25. Portions of the amorphous silicon 25 that are exposed by the second electrode mask are etched away when layers 26 and 27 are etched during the second electrode formation.

Layers 26 and 27 are planar over the amorphous silicon 25. Their planarity facilitates deposition of layers 26 and 27 and thus improves the antifuse yield. In particular, the planarity of barrier layer 26 helps obtain more uniform thickness and eliminate discontinuities in the barrier layer and thus improves the antifuse yield, as explained above in connection with FIG. 3.

As is seen from the above description, antifuse 510 is fabricated using fairly few process steps. Further, the process sequence provides a planar top surface for the amorphous silicon deposition and the top electrode formation, improving the yield and reproducibility of the electrical characteristics. Further, if plug 545 is made of tungsten, no barrier layer between the amorphous silicon 25 and the first conductive layer 538 is needed even if aluminum is used in the first conductive layer 538.

The use of plug 545 as the bottom electrode allows reducing the area of antifuse 510 because a high quality plug with a good contact to first conductive layer 538 can be formed even when via 544 is narrow relative to the thickness of the second dielectric layer 540. Because of the small area of antifuse 510, leakage current and the capacitance of the unprogrammed antifuse are reduced. Of note, in field programmable gate arrays (FPGAs) with thousands or millions of antifuses, even a small size reduction of each antifuse may provide a significant overall size reduction of the FPGA. Further, the second dielectric layer 540 can be made quite thick so as to reduce the capacitance between the first conductive routing channels formed from the first conductive layer 538 and the second conductive routing channels formed from TiW layer 26 and AlCu layer 27. The FPGA speed is increased as a result.

Figure 6:
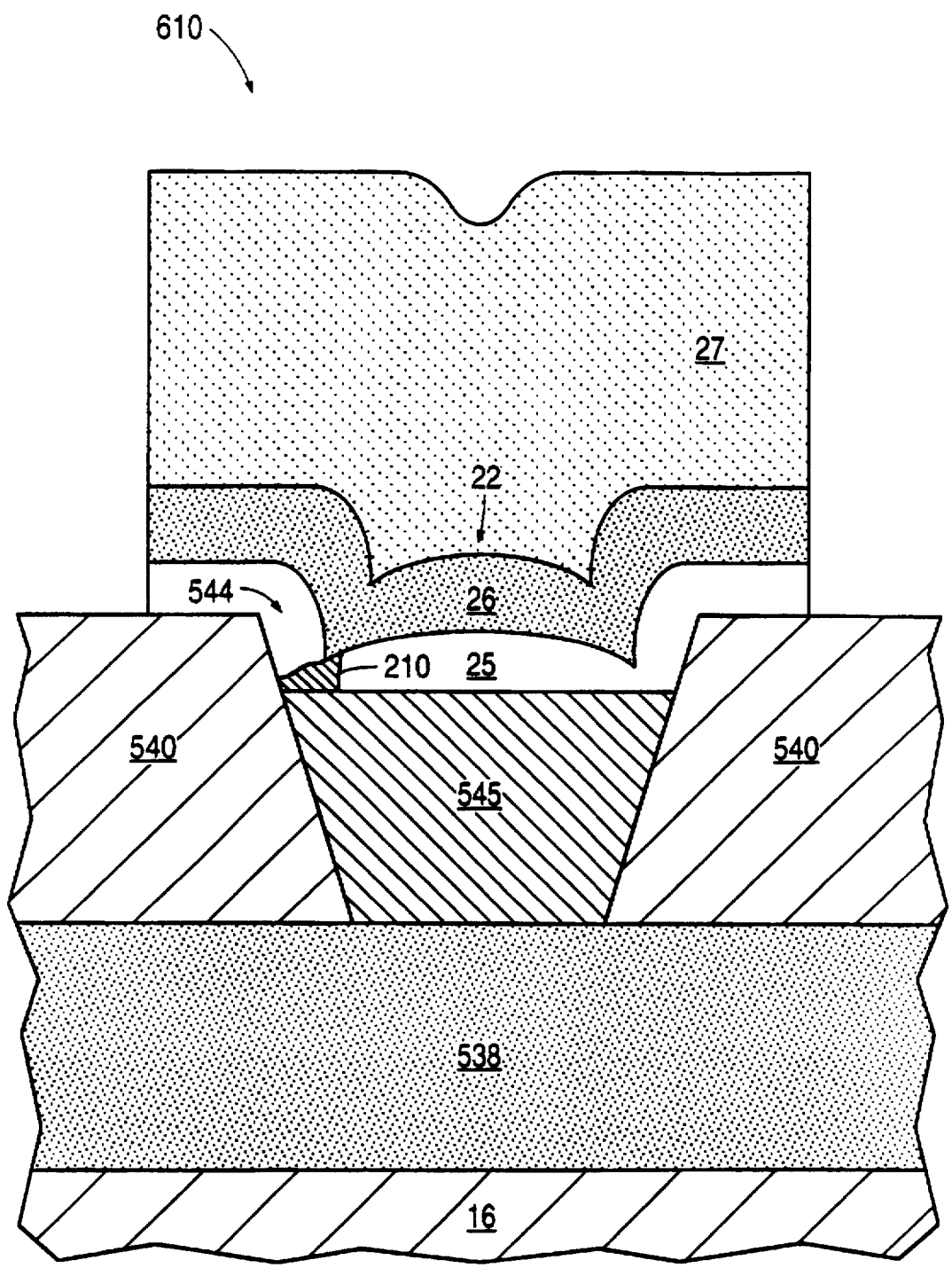

FIG. 6 shows an antifuse 610 similar to antifuse 510. In antifuse 610, plug 545 only partially fills the antifuse via 544. Depending on the manufacturing processes available, formation of plug 545 which only partially fills the via may be simpler than formation of plug 545 which completely fills the via as in FIG. 5.

However, plug 545 of FIG. 6 provides some of the advantages of plug 545 of FIG. 5. In particular, the structure of FIG. 6 allows reducing the antifuse size, leakage current and capacitance, improving the antifuse yield and making the antifuse electrical characteristics more controllable. Namely, plug 545 of FIG. 6 reduces the depth to which amorphous silicon 25, TiW layer 26 and AlCu layer 27 are deposited in via 544, and hence plug 545 facilitates high quality deposition of the three layers even when via 544 is narrow and second dielectric layer 540 is thick. Thus the size, and hence also the leakage current and the capacitance, are reduced, the yield is increased and the electrical characteristics are easier to control and reproduce as explained above in connection with FIG. 5.

Figure 7:
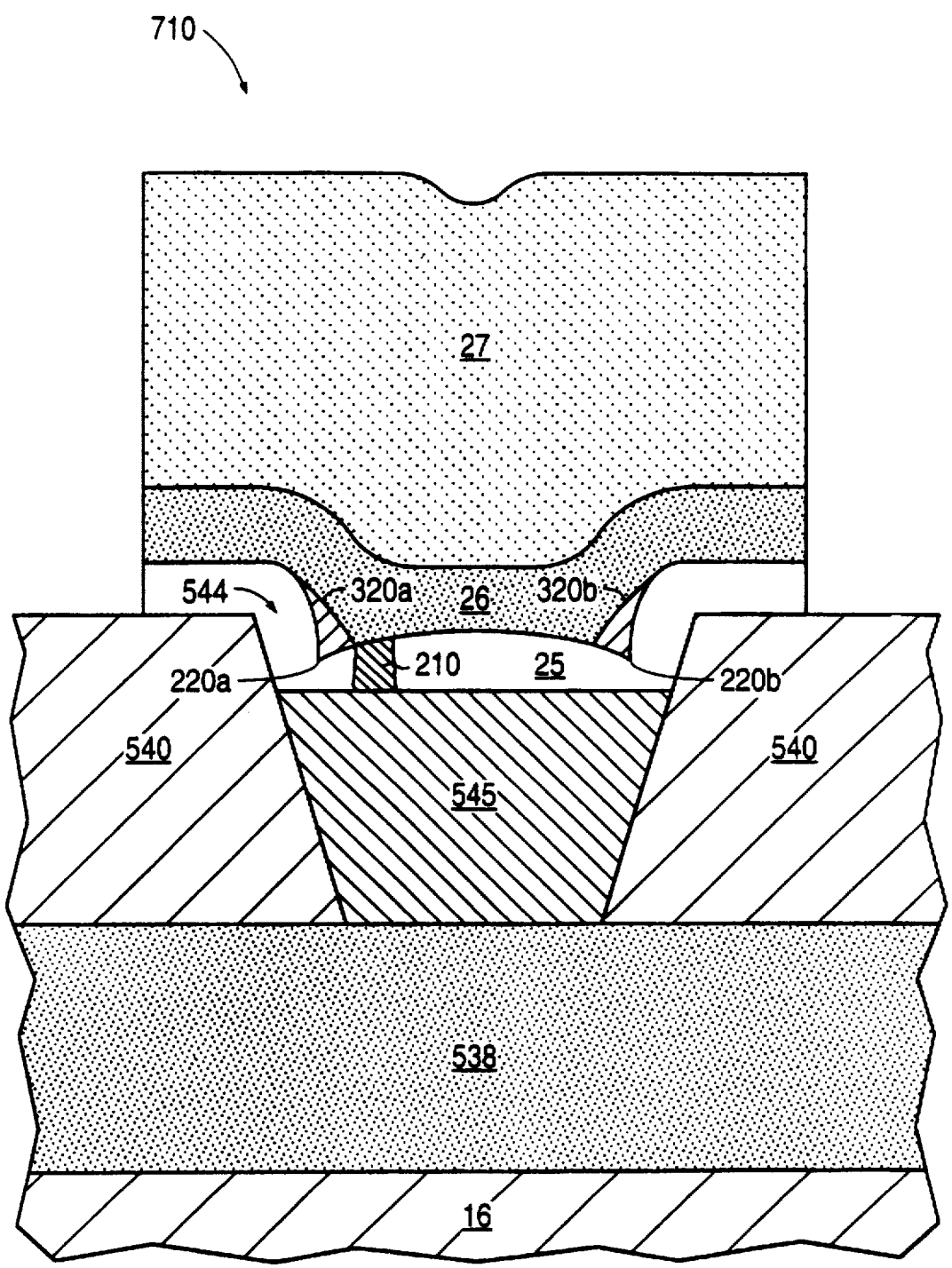

FIG. 7 shows an antifuse 710 which is similar to antifuse 610 but which includes dielectric spacers 320a, 320b over thinner portions 220a, 220b of amorphous silicon 25. Spacers 320a, 320b are formed in some embodiments of silicon dioxide or silicon nitride similarly to spacers 320a, 320b of FIG. 3. Spacers 320a, 320b of FIG. 7 increase the antifuse thermal stability by moving conductive filament 210 farther from silicon dioxide layer 540. Spacers 320a, 320b reduce the leakage current by reducing the contact area between barrier layer 26 and amorphous silicon 25. The spacers improve the yield by improving the thickness uniformity of barrier layer 26 as discussed above in connection with FIG. 3. The spacers make the antifuse electrical characteristics more controllable because the spacers cover the amorphous silicon portions in the via corners, as discussed above in connection with FIG. 3. The spacers reduce the capacitance, and hence increase the circuit speed, by moving portions of top electrode layers 26, 27 farther from plug 545. See the discussion above in connection with FIG. 3.

Figure 8:
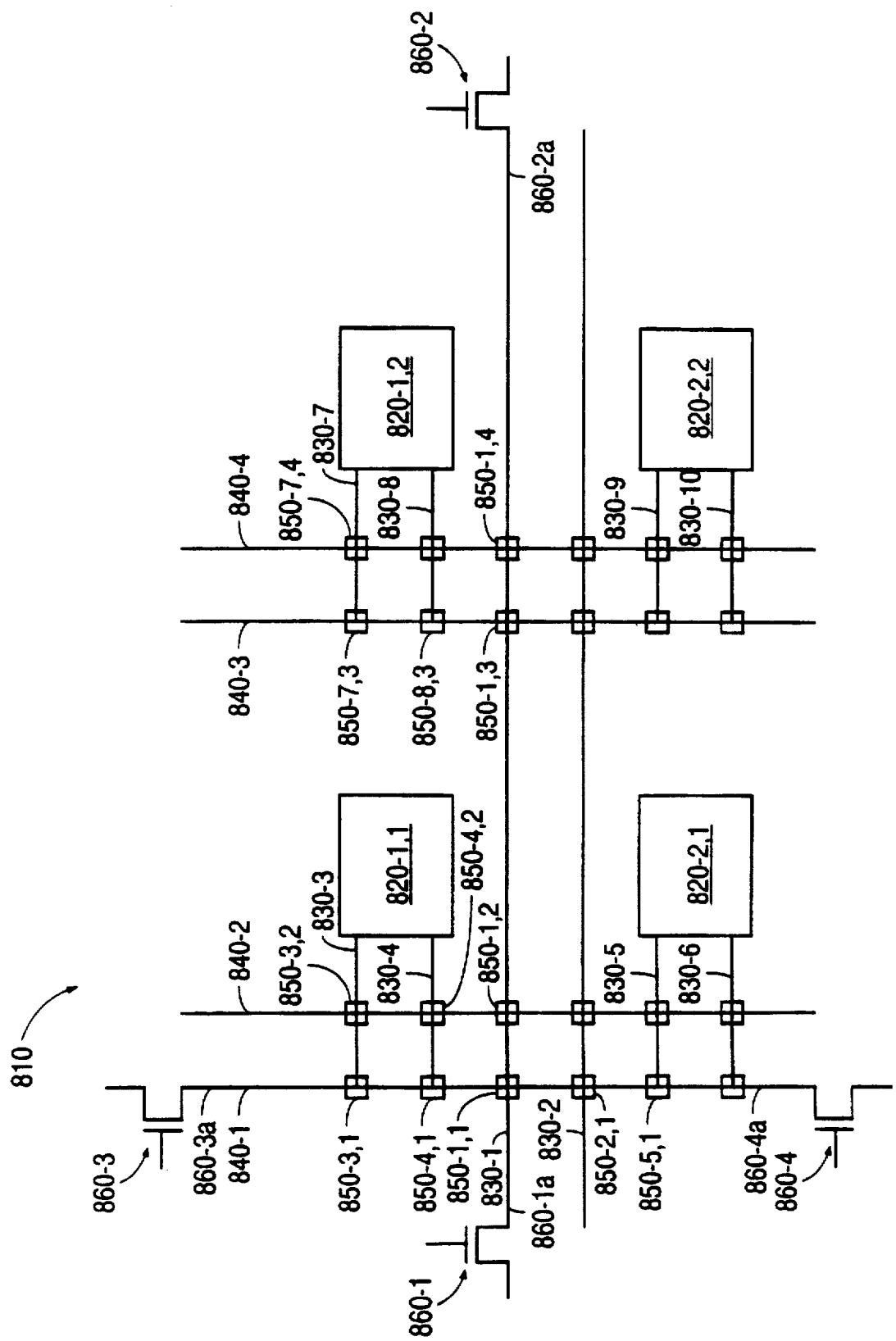
FIG. 8 is a circuit diagram of a gate array according to the invention.

The antifuses of FIGS. 3–7 are suitable for use in field programmable gate arrays such as the gate arrays disclosed in the U.S. patent application Ser. No. 07/738,707 filed by K. E. Gordon and A. K. Chan on Jul. 31, 1991, now U.S. Pat. No. 5,302,546 issued on Apr. 12, 1994, and hereby incorporated herein by reference and U.S. patent application Ser. No. 07/665,103 filed on Mar. 6, 1991 by A. K. Chan et al., now U.S. Pat. No. 5,122,685 issued on Jun. 16, 1992 and hereby incorporated herein by reference. FIG. 8 shows a simplified circuit diagram of such a gate array 810. Gate array 810 has an array of logic cells 820-i,j, i,j=1,2. Gate arrays generally may include hundreds or thousands of logic cells. Gate array 810 includes also horizontal channels 830-i, i=1, . . . , 10 and vertical channels 840-i, i=1, . . . , 4. Vertical channels 840-i are substantially orthogonal to horizontal channels 830-i. Antifuses ("cross links") such as shown, for example, at 850-1,1, 850-1,2 are provided at intersections of the channels. Each cross link is an antifuse of one of the types described above in connection with FIGS. 3–7.

Horizontal channel 830-1 is a metal line connected to a source/drain region 860-1a of transistor 860-1 and to a source/drain region 860-2a of transistor 860-2. Vertical channel 840-1 is a metal line connected to source/drain regions 860-3a, 860-4a of respective transistors 860-3, 860-4. Transistors 860-1, 860-2, 860-3 and 860-4 are part of the programming circuitry that programs the cross links 850-i,j as described more fully in the aforementioned application Ser. No. 07/738,707, now U.S. Pat. No. 5,302,546. Source/drain regions 860-1a, 860-2a, 860-3a and 860-4a are typically diffusion regions in a semiconductor substrate.

Each channel 830-i, 840-i is connected similarly to circuit elements (not shown) formed in the substrate such as transistor source/drain regions.

Figure 9:
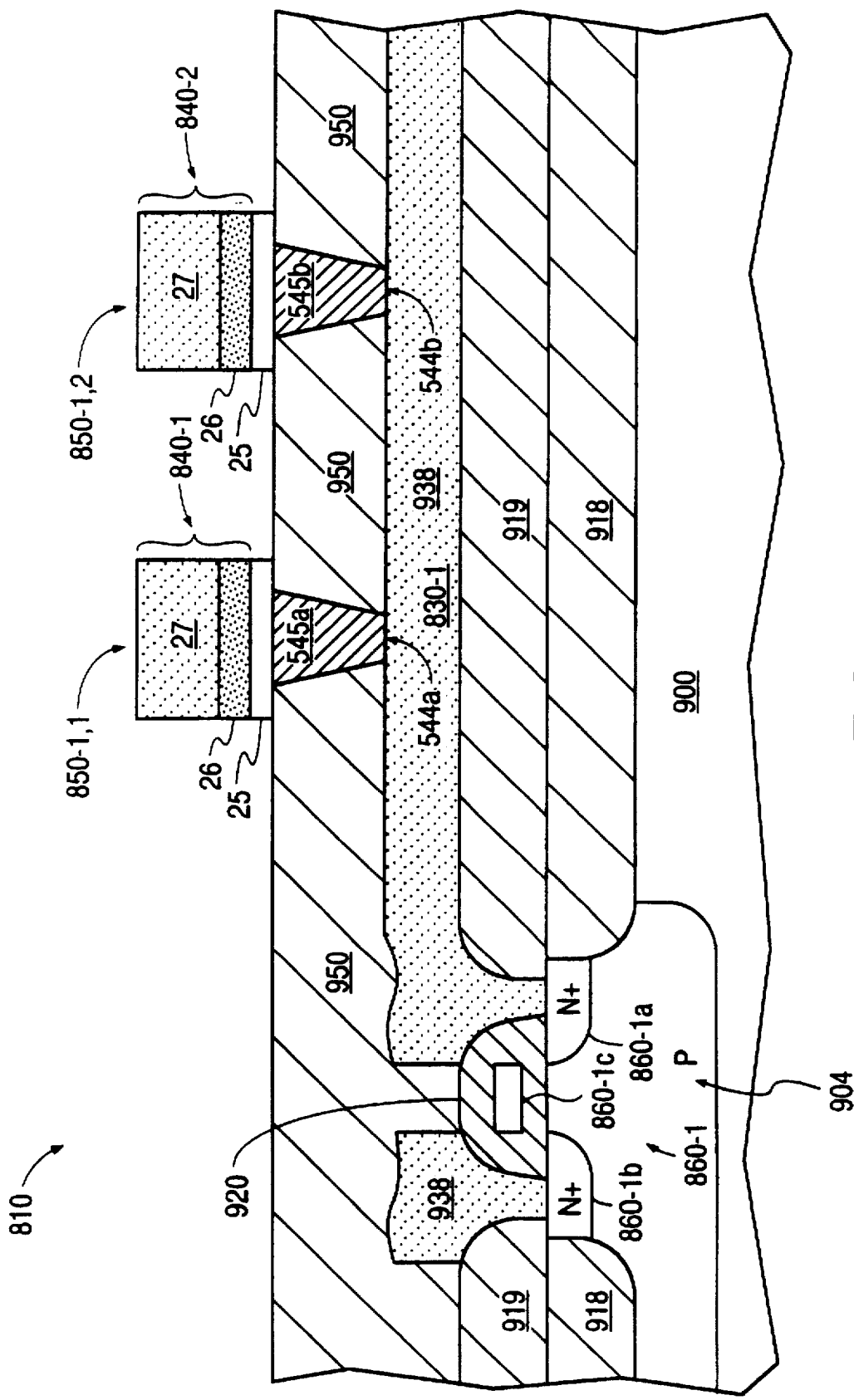
FIGS. 9 and 10 are cross section illustrations of gate arrays represented by the circuit diagram of FIG. 8.

FIG. 9 shows a cross section of gate array 810 wherein cross links 850-i,j are antifuses of the type described above in connection with FIG. 5. Substrate 900 is provided with a P-doped substrate region 904. Source/drain regions 860-1a; 860-1b of transistor 860-1 are formed in region 904. Patterned oxide layers 918, 919 and 920 (shown in cross hatch) also are present. As is well known in the art, oxide layer 918 is a field oxide, boro-phosphosilicate glass layer 919 is a contact oxide, and oxide layer 920 comprises various oxide layers (not shown) formed in the fabrication of gate 860-1c of transistor 860-1. The oxide layers 918, 919 and 920 are suitably patterned and etched to form contact holes down to the various source and drain regions including regions 860-1a and 860-1b.

Using standard techniques, a film 938 of aluminum measuring about 6000 angstroms is sputtered over the patterned oxide layers and into the contact holes to regions 860-1a and 860-1b. Other metals may be used as well. Film 938 of FIG. 9 corresponds to first conductive layer 538 of FIG. 5. Film 938 is patterned and etched using a BCl$_3$, Cl$_2$, CHCl$_3$ standard aluminum dry etch to provide the horizontal channels, such as channel 830-1, and contacts to source/ drain regions of transistors 860-i.

Intermetal dielectric 950 is a thick oxide layer, of about 9000 angstroms thickness, deposited using any suitable standard technique such as, for example, plasma enhanced chemical vapor deposition. Layer 950 corresponds the second dielectric layer 540 of FIG. 5. In one of any suitable techniques, layer 950 comprises two oxide layers (not shown). The first oxide layer is deposited to the selected thickness and planarized. The planarization step involves spinning a resist layer over the deposited oxide and reflowing the resist with a postbake, after which the surface is planarized in an RIE etch-back adjusted for equal resist and oxide etch rates. A second oxide layer then is deposited to ensure dielectric integrity and the 9000 angstrom thickness over the irregular topography.

Antifuse vias 544a and 544b are now formed through the oxide 950 down to the horizontal channel 830-1. Similar vias are formed at the locations of the other cross links. Other vias (not shown) are made at the same time to provide direct connections between the to-be-formed vertical channels 840-i and portions (not shown) of aluminum 938. These portions of aluminum 938 contact the source/drain regions, such as regions 860-3a and 860-4a, which are to be connected to the vertical channels 840-i. Antifuse via masks used to pattern the oxide have the same dimension as the direct-connection via masks. The vias are etched using standard RIE techniques.

Conductive plugs 545a, 545b are formed in the respective vias 544a, 544b. Similar plugs are formed at the locations of the other cross links. Plugs 545a, 545b provide bottom electrodes for the respective antifuses 850-1,1, 850-1,2. The top surface of the plugs is substantially coplanar with the top surface of oxide 950.

Planar amorphous silicon layer 25 of about 1600 angstrom thickness is deposited and patterned over the conductive plugs 545. In some embodiments, amorphous silicon layer 25 is deposited by PECVD as described above in connection with FIG. 5.

An about 2000 angstrom layer 26 of TiW and an about 8000 angstrom layer 27 of aluminum-copper are sputter deposited and patterned by standard techniques to form the vertical channels 840-i. The portions of layers 26 and 27 over vias 544 form the top electrodes of the respective antifuses 850. The portions (not shown) of layers 26 and 27 in the aforementioned direct-connection vias provide the above-described direct connections to aluminum 938.

Using standard techniques, a 5000 angstrom layer of silicon dioxide (not shown) is deposited and pad openings are patterned. Then a 10,000 angstrom layer of silicon nitride (not shown) is deposited and pad openings are patterned. These oxide and nitride layers are used as passivation layers. The structure is then alloyed at 400° C. using standard techniques.

The second level routing channels 840-i extend generally orthogonally to the first level routing channels 830-i. Thick oxide 950 serves to reduce the capacitance between the first level routing channels 830 and the second level routing channels 840. In spite of the large thickness of oxide layer 950, vias 544 can be made narrow because good quality plugs 545 providing a good contact to aluminum layer 938 can be formed even in narrow vias. Significant size reduction of the gate array is thereby made possible. Leakage current and the capacitance of the unprogrammed antifuse are also reduced thereby.

In some variations of the gate array 810 of FIG. 9, the cross links 850-i,j are of the type of antifuse 610 of FIG. 6 or antifuse 710 of FIG. 7.

Figure 10:
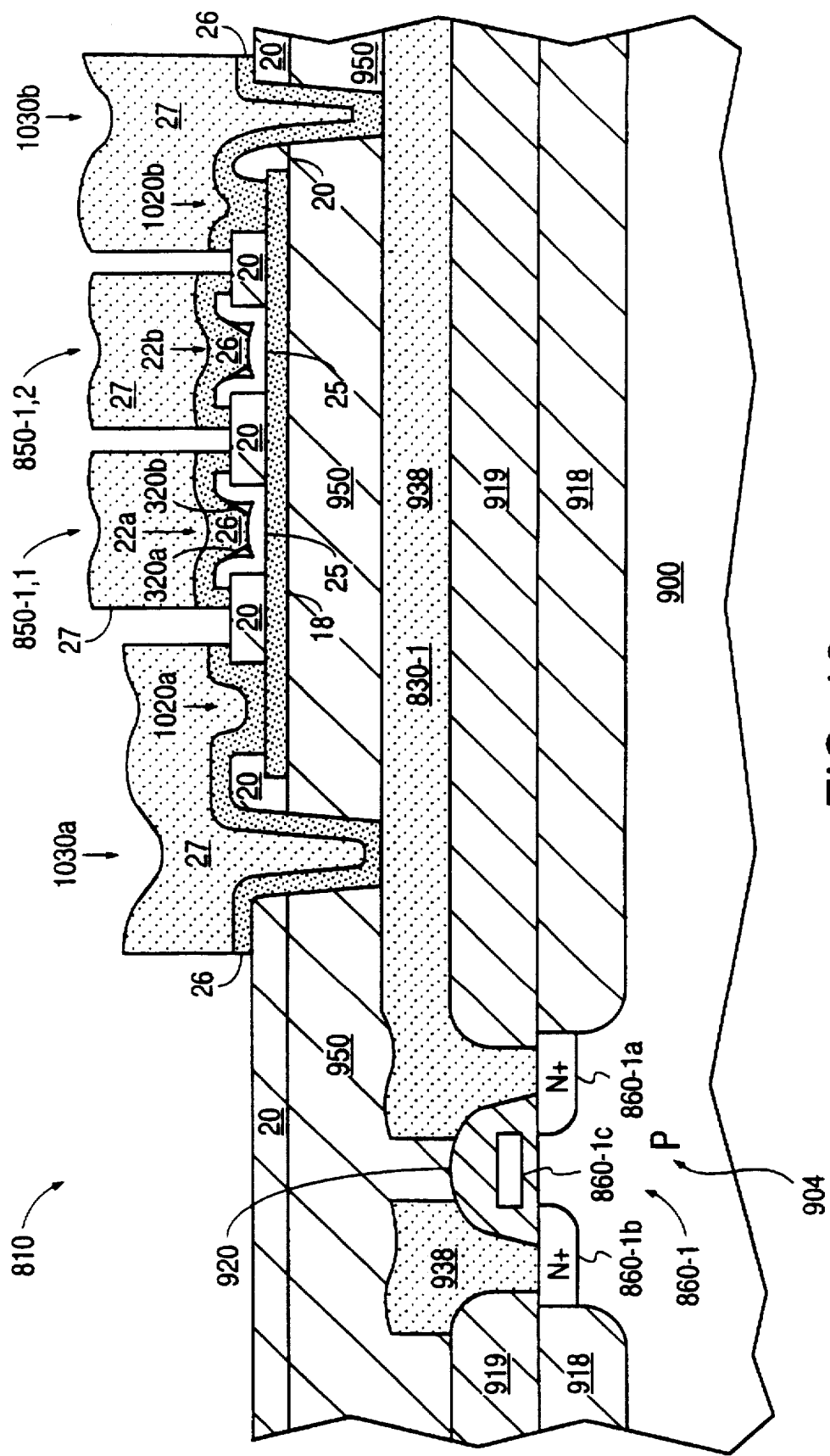

FIG. 10 shows a cross section of gate array 810 in which cross links 850-i,j are of the type described above in connection with FIG. 3. Transistors 860-i, oxide layers and 918, 919 and 920, aluminum 938 and horizontal channels 830-i, and intermetal dielectric 950 are formed as described above in connection with FIG. 9.

Cross links 850-i,j are formed over the intermetal dielectric 950. At this time, transistor source/drain regions such as regions 860-1a, 860-2a, 860-3a and 860-4a are protected by intermetal dielectric 950 and by first level contacts formed from layer 938. Thus the manufacture of gate array 810 of FIG. 10 does not require a special protective cover to protect the transistors during the antifuse formation like the cover required in the prior art circuit of FIG. 1. Moreover, the transistors 860-i in FIG. 10 are protected better during the antifuse formation because the transistors are not exposed to the deposition and etch of the special protective cover itself.

Further, since antifuses 850-i,j are formed above intermetal dielectric 950, the amorphous silicon of the antifuses is not degraded by the high temperatures present in the formation of intermetal dielectric 950.

Antifuses 850-i,j are formed as follows. Bottom electrode layer 18 is deposited and patterned. The bottom electrode layer 18 corresponds to the first conductive layer 18 of FIG. 3 and provides the bottom electrodes for the antifuses. In one embodiment, the bottom electrode layer 18 is TiW, about 2000 angstroms thick, deposited by sputtering.

A dielectric layer 20 is formed over the bottom electrode layer 18. In one embodiment, dielectric layer 20 is a layer of silicon dioxide, about 3000 angstroms thick, deposited using PECVD. Dielectric layer 20 is patterned to form antifuse vias 22a and 22b and contact vias 1020a and 1020b exposing the bottom electrode layer 18. 1600 angstrom layer 25 of amorphous silicon is deposited and patterned over the antifuse vias 22a and 22b. In some embodiments, amorphous silicon layer 25 is deposited by PECVD as described above in connection with FIG. 3.

Then the spacers are formed. A substantially conformal layer of silicon dioxide, about 2000 angstroms hick, is deposited by PECVD over the amorphous silicon layer 25 and etched using isotropic RIE to form spacers 320a and 320b on the sidewalls of via 22a and similar spacers on the sidewalls of via 22b. The spacers cover the thinner portions of the amorphous silicon 25.

Using standard photolithography and etching techniques, vias 1030a and 1030b are formed in the dielectric layer 20 and the intermetal dielectric layer 950. Similar vias are formed for the other cross links. Vias 1030 terminate at the lower metal layer 938. Vias 1030 will allow a plurality of connections between the bottom electrode layer 18 and the lower metal layer 938.

Other vias (not shown) are formed at the same time to provide direct connections between the to-be-formed vertical channels 840-i and portions of aluminum 938 which portions contact source/drain regions that must be connected to vertical channels 840-i. See the discussion above in connection with FIG. 9.

An about 2000 angstrom layer 26 of TiW and an about 8000 angstrom layer 27 of aluminum-copper are sputter deposited and patterned by standard techniques to form vertical routing channels 840-i and the top electrodes of the antifuses. The portions of layers 26 and 27 in vias 22 provide the top electrodes for antifuses 850-i,j. The portions of layers 26 and 27 in vias 1020 and 1030 and between adjacent vias 1020 and 1030 provide spaced-apart connections between the bottom electrode layer 18 and the lower aluminum layer 938. These connections reduce the connection resistance for antifuses 850-i,j. See generally U.S. Pat. No. 4,914,055 issued Apr. 3, 1990 to Gordon et al. The disclosure of U.S. Pat. No. 4,914,055 is hereby incorporated herein by reference thereto.

Other portions (not shown) of layers 26 and 27 provide the above-described direct connections to aluminum 938. See the discussion above in connection with FIG. 9.

Using standard techniques, a 5000 angstrom layer of silicon dioxide (not shown) is deposited and pad openings are patterned. Then a 10,000 angstrom layer of silicon nitride (not shown) is deposited and pad openings are patterned. These oxide and nitride layers are used as passivation layers. The structure is then alloyed at 400° C. using standard techniques.

Figure 11:
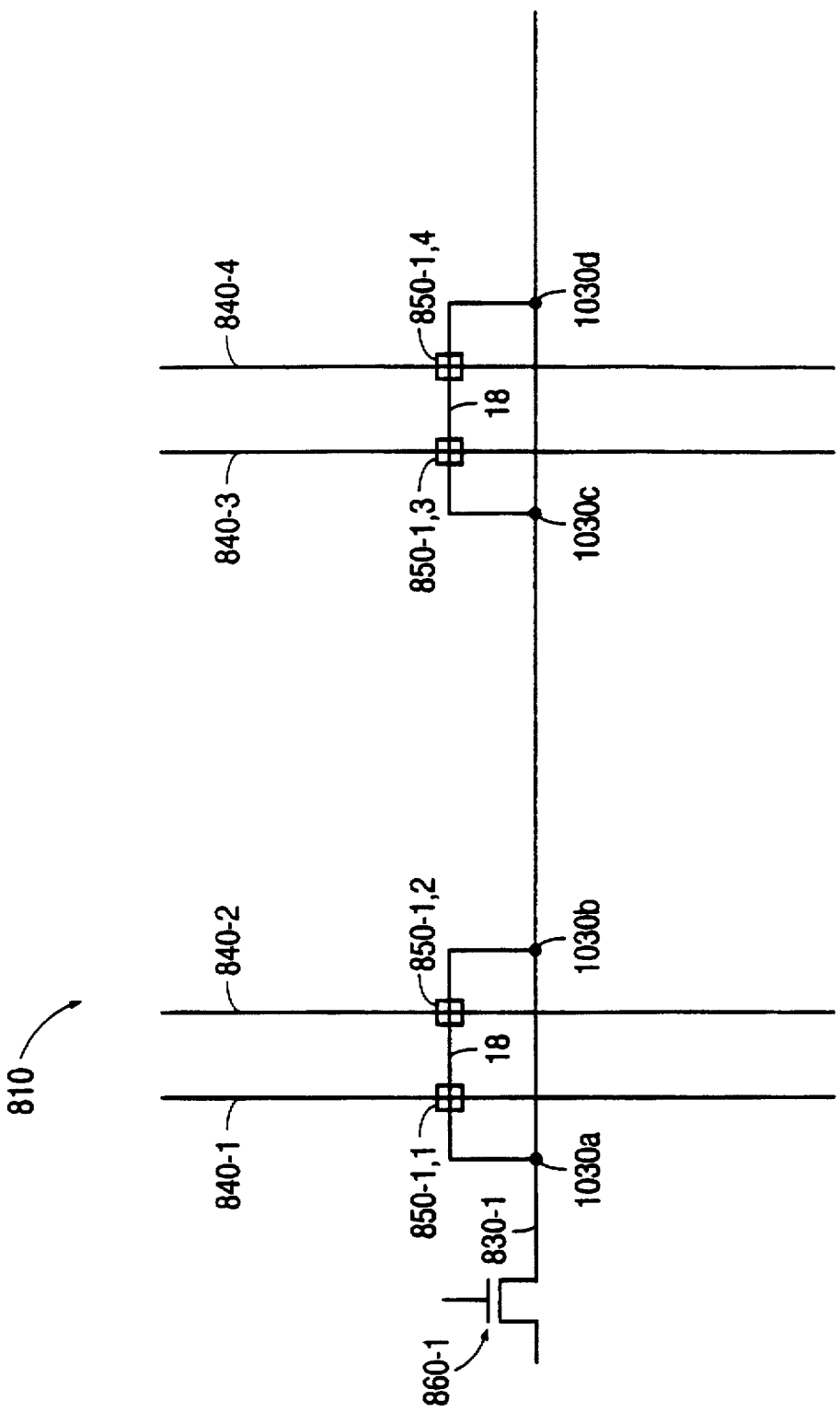
FIG. 11 is a circuit diagram detailing a portion of the gate array of FIG. 10.

FIG. 11 shows a circuit diagram detailing a portion of gate array 810 of FIG. 10. The bottom electrodes 18 of antifuses 850-1,1 and 850-1,2 are connected to horizontal channel 830-1 at the location of vias 1030a, 1030b. The bottom electrodes 18 of antifuses 850-1,3 and 850-1,4 are part of a contiguous portion of layer 18 which portion is connected to horizontal channel 830-1 at the location of similar vias 1030c, 1030d. In general, pairs of adjacent cross links 850-i,j share a contiguous portion of bottom electrode layer 18 which portion is connected to a horizontal channel 830-i. In other embodiments, a greater number of cross links share a contiguous portion of bottom electrode layer 18 which portion is connected to a horizontal channel 830-i.

The circuit of FIGS. 10, 11 is fast because the overall capacitance associated with the metal layers is reduced. One factor reducing the capacitance is the spacers such as spacers 320a, 320b as explained above in connection with FIG. 3. Another factor is as follows. The capacitance is affected by the following three metal structures: (1) the bottom structure—horizontal channels 830-i; (2) the middle structure—bottom electrode layer 18; and (3) the top structure—top electrode layers 26, 27. While the middle layer 18 and the top layer 26, 27 may have different potentials, the middle layer 18 and the bottom channel 830-i are at the same potential since the two layers are connected to each other. Therefore, the capacitance between the middle layer 18 and the bottom channel 830-i is zero. By contrast, in the prior art of FIG. 1, the middle layer, which comprises TiW 26 and aluminum 27, may have a different potential from both the bottom layer 18 and the top layer 30. Thus, in FIGS. 10, 11, the overall capacitance is reduced, and the circuit speed is increased as a result.

Figure 12:
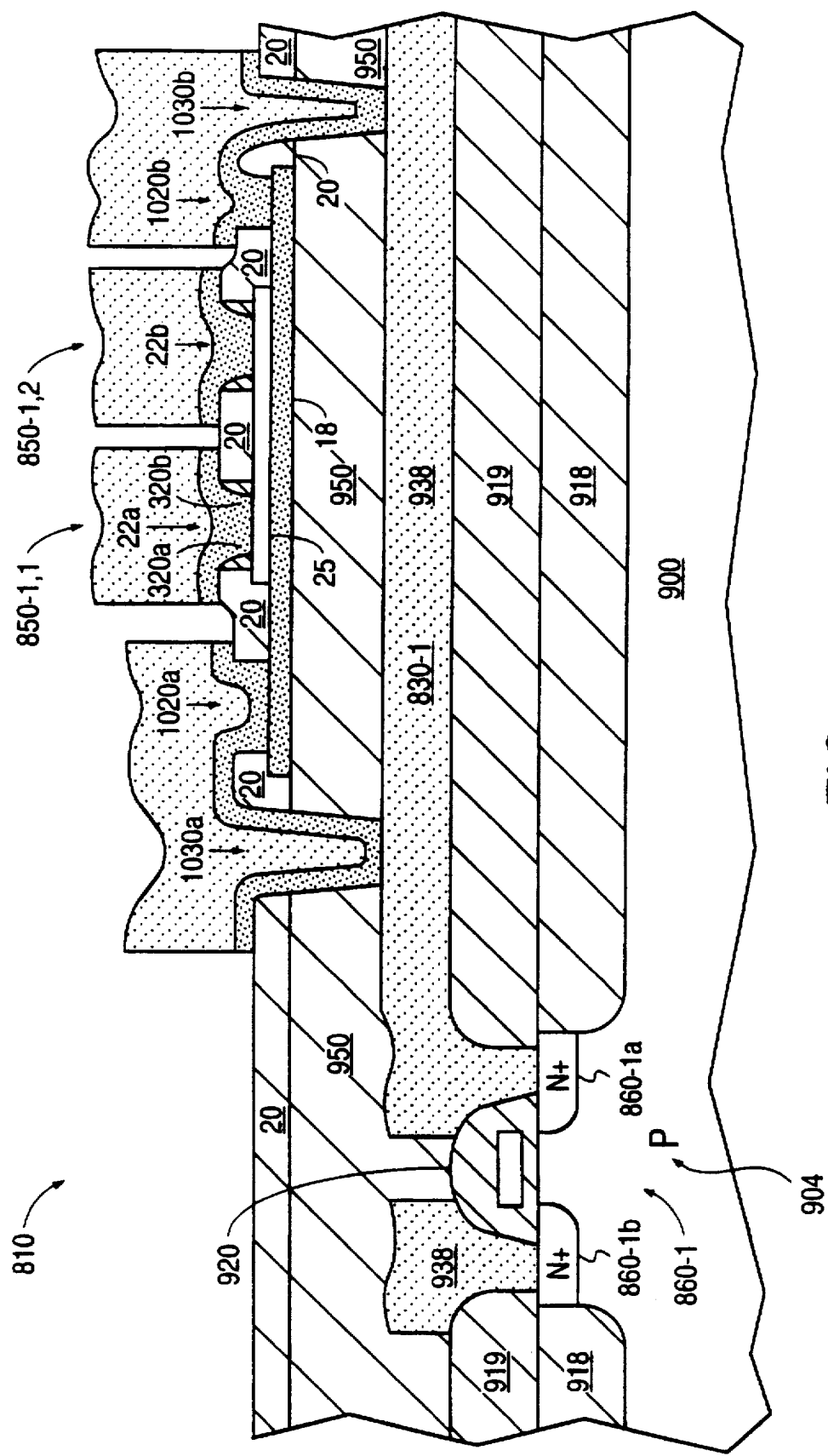
FIG. 12 is a cross section illustration of another gate array represented by the circuit diagram of FIG. 8.

FIG. 12 shows a cross section of gate array 810 in which cross links 850-i,j are of the type described above in connection with FIG. 4. Transistors 860-i, oxide layers 918, 919 and 920, aluminum 938 and horizontal channels 830-i, and intermetal dielectric 950 are formed as described above in connection with FIGS. 9 and 10.

Cross links 850-i,j are formed over intermetal dielectric 950. This eliminates the need for a special protective cover, provides a better protection for the transistors during the cross link formation, and prevents the amorphous silicon of the cross links from being degraded during the formation of the intermetal dielectric, as described above in connection with FIG. 10.

Antifuses 850-i,j of FIG. 12 are formed as follows. Bottom electrode layer 18 is deposited and patterned as described above in connection with FIG. 10. Amorphous silicon layer 25 and dielectric layer 20 are then formed as described above in connection with FIG. 4. Dielectric layer 20 is patterned to form antifuse vias 22a and 22b and contact vias 1020a and 1020b. Similar vias are formed for the other cross links. The antifuse vias 22a and 22b expose amorphous silicon 25, and the contact vias 1020a and 1020b expose the bottom electrode layer 18.

Then spacers 320b, 320a in via 22a and similar pacers in via 22b are formed as described above in connection with FIG. 4.

Using standard photolithography and etching techniques, vias 1030a and 1030b are formed in dielectric layer 20 and the intermetal dielectric 950 as described above in connection with FIG. 10. Similar vias are formed for the other cross links. Other vias (not shown) are formed at the same time to provide direct connections between the to-be-formed vertical channels 840-i and portions of aluminum 938 which portions contact source/drain regions that must be connected to vertical channels 840-i. See the discussion above in connection with FIG. 9.

Layer 26 of TiW and layer 27 of AlCu are deposited and patterned to provide the top electrodes for antifuses 850-i,j and also to provide spaced-apart connections between layers 18 and 938 as described above in connection with FIG. 10.

The passivation layers of silicon dioxide (not shown) and silicon nitride (not shown) are then deposited and patterned as described above in connection with FIG. 10.

The circuit diagram of FIG. 11 which diagram was discussed above as showing gate array 810 of FIG. 10, applies also to gate array 810 of FIG. 12.

In some variations of gate array 810 of FIG. 12, spacers 320a, 320b and the similar spacers in the other antifuse vias are omitted.

Gate array 810 of FIG. 12 advantageously has a low capacitance, and hence a high speed, when compared to the circuit of the prior art FIG. 1, as is seen from the discussion above in connection with FIG. 10.

While the invention has been illustrated with respect to the embodiments described above, other embodiments and variations not described herein are within the scope of the invention. For example, the invention should not be limited by the composition of the metal system used for the interconnects, or by any specific thickness of the various films and oxides used in the structure. These other embodiments and variations are to be considered within the scope of the invention, as defined by the following claims.

What is claimed is:

1. A method for fabricating an integrated circuit comprising an antifuse, the method comprising:

forming an insulating layer over a first conductor;

forming a first opening through the insulating layer;

forming a conductive plug filling the first opening and contacting the first conductor, a top surface of the insulating layer having a portion adjacent to the plug, the portion being substantially coplanar with a top surface of the plug;

forming a layer of programmable material having a substantially planar bottom surface overlaying and contacting the plug, wherein the programmable material is non-conductive over the plug when the antifuse is unprogrammed, and wherein the programmable material provides therethrough a conductive path contacting the plug when the antifuse is programmed; and forming a second conductor overlaying and contacting the programmable material.

2. The method of claim 1 wherein the programmable material comprises amorphous silicon.

3. The structure of claim 1 wherein the plug comprises tungsten.

4. The method of claim 1 wherein the insulating layer is about 9000 angstroms thick.

5. The method of claim 1 further comprising forming a plurality of first conductive routing channels under the insulating layer, the first conductor being one of the first routing channels, and forming a plurality of logic cells connected to selected first routing channels;

wherein the step of forming the first opening comprises forming a plurality of openings in the insulating layer, the first opening being one of the plurality of openings;

wherein the step of forming a conductive plug comprises forming a plurality of conductive plugs in the openings, each conductive plug filling a respective one of the openings, wherein for each opening a top surface of the insulating layer has a portion adjacent to the respective plug and substantially coplanar with a top surface of the respective plug;

wherein the layer of programmable material has over each plug a substantially planar bottom surface contacting the plug; and wherein the method further comprises forming a plurality of second routing channels substantially orthogonal to the first routing channels, the second routing channels overlaying and contacting the programmable material over the plugs, the second conductor being one of the second routing channels.

6. The method of claim 1 wherein the second conductor comprises:

titanium tungsten; and aluminum separated from the programmable material by the titanium tungsten.

* * * * *